(12) United States Patent
Fujikura et al.

(10) Patent No.: US 11,574,809 B2
(45) Date of Patent: Feb. 7, 2023

(54) NITRIDE SEMICONDUCTOR TEMPLATE AND NITRIDE SEMICONDUCTOR DEVICE

(71) Applicants: SUMITOMO CHEMICAL COMPANY, LIMITED, Tokyo (JP); MIE UNIVERSITY, Tsu (JP)

(72) Inventors: Hajime Fujikura, Hitachi (JP); Taichiro Konno, Hitachi (JP); Hideto Miyake, Tsu (JP)

(73) Assignees: SUMITOMO CHEMICAL COMPANY, LIMITED, Tokyo (JP); MIE UNIVERSITY, Tsu (JP)

( * ) Notice: Subject to any disclaimer, the term of this patent is extended or adjusted under 35 U.S.C. 154(b) by 1398 days.

(21) Appl. No.: 15/832,255

(22) Filed: Dec. 5, 2017

(65) Prior Publication Data

US 2018/0158680 A1 Jun. 7, 2018

(30) Foreign Application Priority Data

Dec. 6, 2016 (JP) .............................. JP2016-236873

(51) Int. Cl.
*H01L 33/00* (2010.01)
*H01L 21/02* (2006.01)
(Continued)

(52) U.S. Cl.
CPC ........ *H01L 21/02502* (2013.01); *C30B 25/02* (2013.01); *C30B 29/38* (2013.01);
(Continued)

(58) Field of Classification Search
CPC ............. H01L 21/02502; H01L 33/007; H01L 21/02378; H01L 21/0242; H01L 21/0243;
(Continued)

(56) References Cited

U.S. PATENT DOCUMENTS

2009/0057646 A1 3/2009 Hirayama
2012/0025252 A1* 2/2012 Ichizono ............... H01L 33/501
257/E33.025
(Continued)

FOREIGN PATENT DOCUMENTS

CN 1041660478 A 11/2014
JP 2008-115023 A 5/2008
(Continued)

OTHER PUBLICATIONS

Miyake et al., "Annealing of an AlN buffer layer in N2—CO for growth of a high-quality AlN film on sapphire", Applied Physics Express, 2016, vol. 9, 5 pages.

*Primary Examiner* — Davienne N Monbleau
*Assistant Examiner* — Nader M Elmarhoumi
(74) *Attorney, Agent, or Firm* — Birch, Stewart, Kolasch & Birch, LLP (57) ABSTRACT

There is provided a method for manufacturing a nitride semiconductor template constituted by forming a nitride semiconductor layer on a substrate, comprising: (a) forming a first layer by epitaxially growing a nitride semiconductor containing aluminum on the substrate; (b) applying annealing to the first layer in an inert gas atmosphere; and (c) forming a second layer by epitaxially growing a nitride semiconductor containing aluminum on the first layer by a vapor phase growth after performing (b), and constituting the nitride semiconductor layer by the first layer and the second layer.

4 Claims, 5 Drawing Sheets

(51) Int. Cl.
*H01L 21/324* (2006.01)
*C30B 29/40* (2006.01)
*C30B 29/68* (2006.01)
*C30B 25/02* (2006.01)
*C30B 33/02* (2006.01)
*C30B 29/38* (2006.01)

(52) U.S. Cl.
CPC ............ *C30B 29/403* (2013.01); *C30B 29/68* (2013.01); *C30B 33/02* (2013.01); *H01L 21/0242* (2013.01); *H01L 21/0243* (2013.01); *H01L 21/0254* (2013.01); *H01L 21/0262* (2013.01); *H01L 21/02378* (2013.01); *H01L 21/02433* (2013.01); *H01L 21/02458* (2013.01); *H01L 21/02694* (2013.01); *H01L 21/3245* (2013.01); *H01L 33/007* (2013.01)

(58) Field of Classification Search
CPC ......... H01L 21/02433; H01L 21/02458; H01L 21/0254; H01L 21/0262; H01L 21/02694; H01L 21/3245; H01L 21/02656; H01L 21/324; H01L 33/32; C30B 25/02; C30B 29/38; C30B 29/403; C30B 29/68; C30B 33/02

See application file for complete search history.

(56) References Cited

U.S. PATENT DOCUMENTS

| | | |
|---|---|---|
| 2012/0183809 A1 | 7/2012 | Kinoshita et al. |
| 2014/0203326 A1 | 7/2014 | Mukherjee et al. |
| 2014/0227864 A1 | 8/2014 | Okuno et al. |
| 2014/0264363 A1* | 9/2014 | Zhu .................... H01J 37/3405 438/93 |
| 2020/0127163 A1* | 4/2020 | Fujikura ................ H01L 33/32 |

FOREIGN PATENT DOCUMENTS

| | | |
|---|---|---|
| JP | 2009-54780 A | 3/2009 |
| JP | 2010-111556 A | 5/2010 |
| JP | 2010-196578 A | 9/2010 |
| JP | 2014-154838 A | 8/2014 |
| JP | 2015-42598 A | 3/2015 |
| JP | 2016-154221 A | 8/2016 |
| WO | WO 2011/037251 A1 | 3/2011 |

* cited by examiner

NITRIDE SEMICONDUCTOR TEMPLATE AND NITRIDE SEMICONDUCTOR DEVICE

BACKGROUND

Technical Field

The present disclosure relates to a method for manufacturing a nitride semiconductor template, a nitride semiconductor template, and a nitride semiconductor device.

Description of the Related Art

A light-emitting diode (LED) emitting light in an ultraviolet wavelength range is formed by laminating a nitride semiconductor layer containing aluminum (Al) on a base substrate. A nitride semiconductor template having a nitride semiconductor film containing Al is used as the base substrate in some cases. Such a nitride semiconductor template is constituted by forming the nitride semiconductor film containing Al (for example, aluminum nitride (AlN) film) having a thickness of several 100 nm to several 10 μm on a heterogeneous substrate such as a sapphire substrate or a silicon carbide (SiC) substrate. For such a nitride semiconductor template, there is proposed a technique of improving a quality of the thin nitride semiconductor film such as a thin AlN film on a substrate by annealing (see non-patent document 1, for example).

Non-patent document 1: H. Miyake et al., "Annealing of an AlN buffer in $N_2$—CO for growth of a high-quality AlN film on sapphire", Applied Physics Express 9, 025501 (2016)

SUMMARY

However, in processing conditions of annealing by the abovementioned conventional art, annealing cannot be applied efficiently. Further, when an efficiency of annealing is improved by changing the processing conditions, there is a problem that a surface state of the nitride semiconductor film after annealing is deteriorated.

An object of the present disclosure is to provide a technique of efficiently obtaining a high-quality nitride semiconductor template and a nitride semiconductor device using this template.

According to an aspect of the present disclosure, there is provided a method for manufacturing a nitride semiconductor template constituted by forming a nitride semiconductor layer on a substrate, including:

(a) forming a first layer by epitaxially growing a nitride semiconductor containing aluminum on the substrate;

(b) applying annealing to the first layer in an inert gas atmosphere; and (c) forming a second layer by epitaxially growing a nitride semiconductor containing aluminum on the first layer by a vapor phase growth after performing (b), and constituting the nitride semiconductor layer by the first layer and the second layer.

According to another aspect of the present disclosure, there is provided a nitride semiconductor template having a nitride semiconductor layer formed on a substrate,
the nitride semiconductor layer including:
a first layer formed on the substrate, made of nitride semiconductor containing aluminum, with a substrate-side surface being nitrogen polarity plane, and with a surface opposing to the nitrogen polarity plane being a group-III polarity plane; and
a second layer formed on the group-III polarity plane of the first layer, and made of nitride semiconductor containing aluminum,
wherein the first layer and the second layer are distinguished depending on a difference of an impurity concentration.

According to the present disclosure, the high-quality nitride semiconductor template and the nitride semiconductor device using this template can be obtained efficiently.

DETAILED DESCRIPTION OF THE PRESENT DISCLOSURE

<Knowledge Obtained by Inventors>

A single-crystal AlN substrate, a nitride semiconductor template having a nitride semiconductor film containing aluminum (Al), etc., is used as a base substrate of the LED emitting light in an ultraviolet wavelength range (simply referred to as an "ultraviolet LED" hereafter).

The single-crystal AlN substrate is generally realized by growing an AlN film having a thickness of several mm to several cm on a heterogeneous substrate using a sublimation method, and thereafter removing the heterogeneous substrate. Thereby, a low-dislocation single-crystal AlN substrate in which a dislocation density of a front surface is $1\times10^5$ numbers/$cm^2$ or less, is obtained. However, it cannot be said that a sufficient single-crystal AlN substrate is obtained from viewpoints of a productivity and characteristics of the ultraviolet LED, due to a difficulty of realizing a large substrate having a diameter of 1 inch or more heretofore, and a large amount of an absorption in the ultraviolet region by mixture of impurities.

In contrast, the nitride semiconductor template is constituted by forming the nitride semiconductor film containing Al such as the AlN film for example having a thickness of several 100 nm to several 10 μm, on the heterogeneous substrate such as a sapphire substrate or SiC substrate. Since a thickness of the nitride semiconductor film is small, cracks are hardly generated, and it is easy to increase a diameter of the nitride semiconductor template. Further, the nitride semiconductor template is more advantageous than the single-crystal AlN substrate obtained by the sublimation method in terms of increasing the diameter, a transparency, etc., because a vapor phase growth method capable of suppressing a mixture of impurities such as MOVPE (Metal-Organic Vapor Phase Epitaxy) method or HVPE (Hydride Vapor Phase Epitaxy) method, can be used.

Therefore, it is conceivable that the nitride semiconductor template is used for the ultraviolet LED as its base substrate, in consideration of a large diameter and the transparency, etc., of the template.

Incidentally, in the nitride semiconductor template realized so far, there is a problem that the dislocation density of the front surface sometimes becomes high (for example, more than $1 \times 10^9$ numbers/cm$^2$), when a film thickness of the nitride semiconductor film containing Al is thin (a thickness of several μm). Further, there is a problem that cracks are easily generated because there is a necessity for processing a seed substrate to be a base or there is a necessity for increasing the thickness of the nitride semiconductor film containing Al (for example, more than 20 μm), when the dislocation density is as low as $1 \times 10^8$ numbers/cm$^2$ level or less.

In order to solve such problems, the non-patent document 1 discloses a method of improving a quality of the thin AlN film on the sapphire substrate by annealing. Namely, the non-patent document 1 discloses as follows: the AlN film having a thickness of about 300 nm is grown on the sapphire substrate, thereafter its substrate and the AlN film are subjected to annealing at a high temperature of 1600° C. or more and in $N_2$—CO mixing atmosphere, and thereby the dislocation density of the AlN film is decreased to $1 \times 10^8$ numbers/cm$^2$ level. The reason why annealing is applied to the AlN film in $N_2$—CO mixing atmosphere, is to suppress the deterioration of a surface of AlN (a white turbidity of the surface) during annealing.

However, in a growth apparatus used in general MOVPE method or HVPE method, it is not assumed to flow a gas containing carbon monoxide (CO). Therefore, it is necessary to prepare an annealing apparatus capable of flowing CO-gas separately from the growth apparatus, when the method disclosed in the non-patent document 1 is applied. Further, for example, there is a concern that a purity of the nitride semiconductor film to be grown is deteriorated by the mixture of impurities such as carbon (C) and oxygen (O), when the growth apparatus is constituted so that CO-gas can be introduced.

In contrast, as a result of additional test by the present inventors, when annealing is applied to the nitride semiconductor film containing Al at 1600° C. or more in nitrogen ($N_2$) gas atmosphere that can be realized by the growth apparatus used in the general MOVPE method or HVPE method, it is found that a deterioration occurs on the surface of the nitride semiconductor film because this is not annealing applied in $N_2$—CO mixing atmosphere.

In view of these circumstances, and as a result of diligent studies by the present inventors, the following new knowledge is obtained. Namely, even when the nitride semiconductor film containing Al has a roughened front surface to an extent apparently not suitable for a re-growth thereon, an additional nitride semiconductor film containing Al is grown on the roughened front surface of the nitride semiconductor film under a prescribed condition, and thereby the roughened front surface can be a mirror surface, and a dislocation density on a re-grown front surface can be $1 \times 10^9$ numbers/cm$^2$ or less.

The present disclosure is based on the abovementioned new knowledge found by the present inventors.

An Embodiment of the Present Disclosure

An embodiment of the present disclosure will be described hereafter, with reference to the drawings.

(1) Constitution of a Nitride Semiconductor Template

First, an explanation will be given for a schematic constitution example of a nitride semiconductor template of this embodiment.

Figure 1:
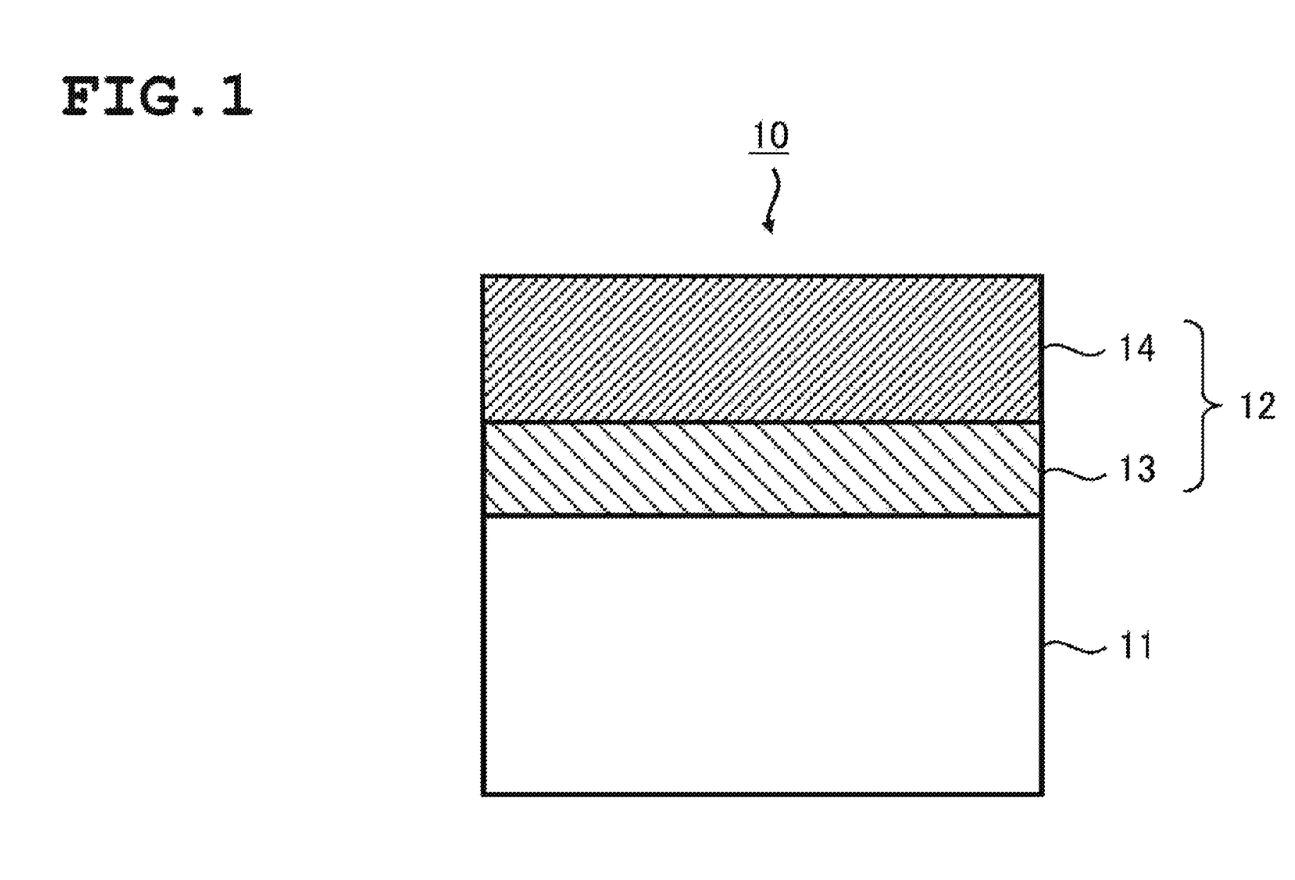
FIG. 1 is a cross-sectional view showing a schematic constitution example of a nitride semiconductor template according to an embodiment of the present disclosure.

FIG. 1 is a cross-sectional view showing the schematic constitution example of the nitride semiconductor template of this embodiment.

The nitride semiconductor template 10 (also referred to as a template 10 hereafter) exemplified in this embodiment is used as a base substrate when a semiconductor device such as LED is manufactured, and is constituted as a substrate-shaped structure body. Specifically, the template 10 is constituted including a substrate 11 and a nitride semiconductor layer 12.

(Substrate)

Substrate 11 functions as a supporting substrate for supporting the nitride semiconductor layer 12. Hereafter, an upper surface (a nitride semiconductor layer 12—side surface) of the substrate 11 is referred to as "a front surface (or a first main surface)", and a lower surface of the substrate 11 located on an opposite side thereof is referred to as "a back surface (or a second main surface)".

For example, the substrate 11 is constituted of a sapphire ($Al_2O_3$) substrate, with a surface inclined by 0.1 to 3° in a-axis direction or m-axis direction from C-plane ((0001) plane) used as the front surface.

Further, the front surface of the substrate 11 is a mirror surface for example, in other words, is a so-called epi-ready surface on which a group-III nitride semiconductor can be epitaxially grown. Specifically, a root-mean-square roughness (RMS) on the front surface of the substrate 11 is for example 10 nm or less, preferably 1 nm or less. The term "RMS" used in this specification means a value obtained by analyzing an image having a size of 5 μm×5 μm using an atomic force microscope (AFM). In contrast, the back surface of the substrate 11 is not particularly limited. It is conceivable that the back surface of the substrate 11 is formed into a mirror surface similar to a front surface side, or a so-called lap-surface which is a rough surface having random irregularities.

A substrate having a diameter of 2 to 8 inches for example, is used as the substrate 11. Thereby, the template 10 corresponds to a large substrate size having a diameter of more than 1 inch. Further, a thicker substrate 11 is more preferable as a diameter of a wafer is more increased, from a viewpoint of suppressing an occurrence of warpage of the wafer after a LED structure is laminated. For example, it is conceivable that the thickness of the substrate 11 is set to 300 μm to 2 mm.

(Nitride Semiconductor Layer)

The nitride semiconductor layer 12 is a layer made of nitride semiconductor containing aluminum (Al), and formed on the substrate 11. Aluminum nitride (AlN) is exemplified as the nitride semiconductor containing Al. However, this embodiment is not limited thereto. Namely, in addition to AlN, the nitride semiconductor containing Al may be indium aluminum nitride (AlInN), aluminum gallium nitride (AlGaN), or aluminum gallium indium nitride (AlInGaN), as long as it is represented by $In_{1-x-y}Al_xGa_yN$ ($0 \leq x+y \leq 1$, $0 < x \leq 1$, $0 \leq y \leq 1$). Hereafter, the nitride semiconductor layer 12 made of AlN is also referred to as AlN layer 12.

Further, the nitride semiconductor layer 12 is constituted in a two-layer structure of a first layer 13 (also referred to as a layer 13 hereafter) located on a side facing the substrate 11 and a second layer 14 (also referred to as a layer 14 hereafter) formed so as to overlap on the layer 13.

The layer 13 and the layer 14 constituting the nitride semiconductor layer 12, are distinguished from each other depending on a difference of an impurity concentration. For example, a larger amount of oxygen as the impurity is contained in the layer 13 close to a substrate 11—side than the layer 14, when impurity concentrations of the layer 13 and the layer 14 are compared based on analysis results obtained by a secondary ion mass spectrometry (SIMS).

Such a difference in oxygen concentrations between the layer 13 and the layer 14 occurs due to a difference of crystallinity of the nitride semiconductor containing Al during a growth of each layer. Namely, since there is an increased dislocation density in the nitride semiconductor containing Al when the layer 13 is grown, a large amount of oxygen is taken in the layer 13 by diffusion from the substrate 11—side during growth or by mixing from a growth atmosphere. Its concentration is about $1 \times 10^{18}$ to $1 \times 10^{21}/cm^3$ for example. In contrast, a quality of the layer 13 to be a base is improved (dislocations in the layer 13 are reduced) by annealing described later at a start of a growth of the layer 14, and therefore the layer 14 is also a low-dislocation layer made of nitride semiconductor containing Al. Therefore, although oxygen is slightly diffused from the layer 13 during the growth of the layer 14, a taking-in of oxygen is suppressed as a whole. Although an oxygen concentration of the layer 14 depends on an atmosphere in a growth apparatus, it is typically $1 \times 10^{18}/cm^3$ or less for example.

Therefore, in the nitride semiconductor layer 12, by measuring impurity concentrations, it is possible to identify the two-layer structure of the layer 13 and the layer 14, and further it is possible to identify an existence position of an interface between the layer 13 and the layer 14. It is conceivable that the measurement of the impurity concentration is performed using a result obtained by SIMS analysis for example. However, other publicly known method can also be used.

(First Layer)

The layer 13 being one of the layers constituting the two-layer structure is a layer formed by epitaxially growing the nitride semiconductor containing Al on the substrate 11, and is a layer subjected to annealing in an inert gas atmosphere, as described in detail later. By thus forming the layer 13, it is constituted so as to have a polarity in a growth direction. Specifically, the layer 13 is constituted so that most of a substrate 11—side surface is nitrogen (N) polarity plane, and most of a surface opposing to N-polarity plane (namely, a layer 14—side surface) is a group-III polarity plane. A front surface of the layer 13 which is the layer 14—side surface may include slight N-polarity plane (for example, N-polarity plane of about 10% or less of a front surface area). Even in such a case, an entire front surface of the layer 14 is the group-III polarity plane by growing the layer 14 as described later, due to a property in which the nitride semiconductor itself containing Al is easily grown to the group-III polarity at a high temperature.

Further, in the layer 13, the dislocations of the front surface (namely, the layer 14—side surface) are reduced by applying annealing. Specifically, for example, an average dislocation density on the front surface is $1 \times 10^9$ numbers/cm² or less. Further, for example, a half-value width (a full width of half maximum) of (10-12) diffraction obtained by X-ray rocking curve (XRC) measurement for the front surface using X-ray diffraction (XRD), is 600 seconds or less, more preferably 400 seconds or less.

However, since the layer 13 is subjected to annealing in the inert gas atmosphere, the front surface is deteriorated in some cases as compared with a case of not undergoing annealing. Specifically, a surface roughness RMS (also referred to as RMS hereafter) of the layer 13 is 1 to 50 nm for example.

A decrease of the dislocation density in the nitride semiconductor containing Al and an increase of the surface roughness by annealing indicate that constituent atoms in the nitride semiconductor containing Al or on the front surface move relatively freely during annealing. A dislocation part is originally in a higher energetic state than a perfect crystal, because a large number of dangling-bonds of the constituent atoms exist in the dislocation part. However, a driving force is generated for eliminating the dislocations so as to lower an energy of the whole crystal, in a state when the constituent atoms of the nitride semiconductor containing Al can freely move by applying annealing as described in detail later.

However, in the state when such constituent atoms can relatively freely move, conventionally, annealing under such a condition is not adopted as a method for reducing the dislocations in the nitride semiconductor containing Al because the front surface of the nitride semiconductor containing Al is roughened as described above.

Further, the layer 13 is formed so that the layer 13 has a thickness of forming the layer 13 as a continuous film and not allowing cracks to be generated. Specifically, the layer 13 is formed to have a thickness of 100 to 800 nm for example. When the thickness of the layer 13 is less than 100 nm, there is a problem that it may not become the continuous film. By setting the thickness of the layer 13 to 100 nm or more, it can be formed as the continuous film. Further, when the thickness of the layer 13 is more than 800 nm, there is a problem that cracks may be generated during formation or annealing thereafter. By setting the thickness of the layer 13 to 800 nm or less, it can be formed so that cracks are not generated. The layer 13 is formed to have the thickness of 100 to 800 nm for example. Particularly, the layer 13 is preferably formed to have a thickness of 200 to 800 nm.

(Second layer)

The layer 14 being the other layer constituting the two-layer structure is a layer formed by epitaxially growing the nitride semiconductor containing Al on the front surface of the layer 13 as described in detail later. In the layer 14 thus formed, its entire front surface is the group-III polarity plane as described above.

Further, the layer 14 is a layer in which dislocations are reduced (a low-dislocation layer) similar to the layer 13, because it is formed on the layer 13 in which the dislocations are reduced. Specifically, for example, an average dislocation density on the front surface (namely, an opposite side surface to a layer 13—side surface), is $1 \times 10^9$ numbers/cm² or less.

In addition, the layer 14 is formed on the layer 13 in which the dislocations are reduced, and therefore cracks are hardly generated even when the layer 14 is formed thick. When there are many dislocations in a base layer, the base layer is similarly in a state of including many cleavages inside of the base layer. Therefore, a layer to be formed thereon becomes weak against a stress, and is easily broken. In contrast, when the low-dislocation layer such as the layer 13 is used as a base, a weak part in the layer 14 to be formed on the layer 13 is reduced, and therefore the layer 14 is hardly broken.

Specifically, the layer 14 is formed to have a thickness of 100 nm to 20 μm for example. More preferably, the second layer 14 is formed to have the thickness of 3 to 20 μm for example. Even when the layer 14 has the thickness of 3 μm or more, it is constituted as a crack-free layer.

Further, the layer 14 is grown so as to overlap on the layer 13, and therefore the front surface of the layer 14 is flattened as compared with a case of the layer 13 only. Specifically, RMS of the front surface of the layer 14 is 10 nm or less, more preferably 1 nm or less.

(2) A Method for Manufacturing a Nitride Semiconductor Template

Next, an explanation will be given for a procedure for manufacturing the template 10 having the abovementioned constitution, namely, a method for manufacturing the nitride semiconductor template of this embodiment.
(Constitution Example of a Growth Apparatus)

Here, first, an explanation will be given for a constitution example of a growth apparatus used for manufacturing the template 10.

Figure 2:
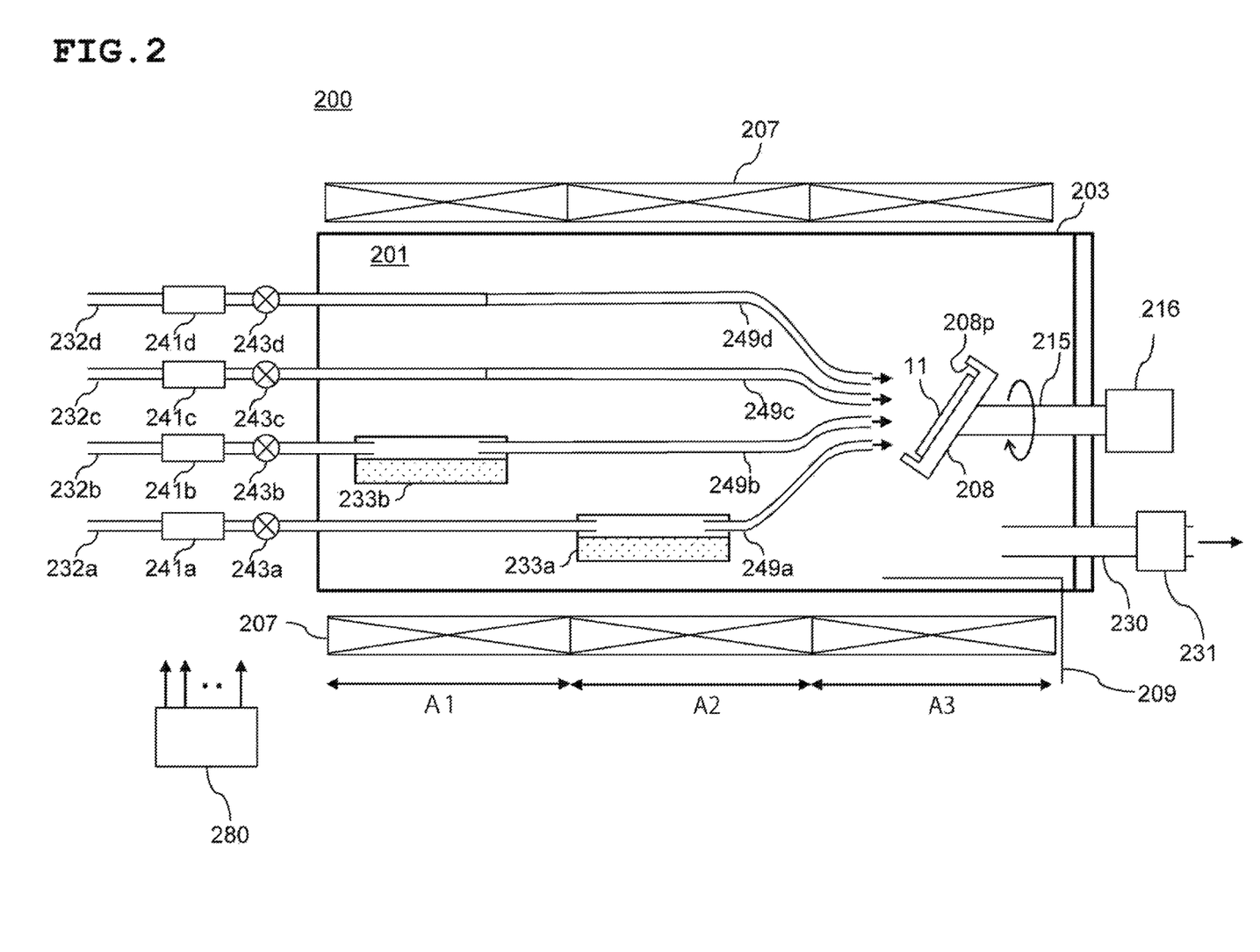
FIG. 2 is a schematic view showing a specific example of a growth apparatus used for manufacturing the nitride semiconductor template according to an embodiment of the present disclosure.

FIG. 2 is a schematic view showing a specific example of the growth apparatus used for manufacturing the nitride semiconductor template of this embodiment.

The example of the figure shows a Hydride Vapor Phase Epitaxy apparatus (HVPE apparatus) as a specific example of the growth apparatus.

The HVPE apparatus 200 includes an airtight container 203 which is made of a heat-resistant material such as quartz or alumina, and which has a film-forming chamber 201 formed therein. A susceptor 208 is provided in the film-forming chamber 201, for holding the substrate 11. The susceptor 208 has a pocket 208p for housing the substrate 11, with its front surface as an upper side. The susceptor 208 is connected to a rotating shaft 215 of a rotating mechanism 216, and is configured so that the substrate 11 placed on the susceptor 208 is rotatable in a circumferential direction (a direction along a main surface) by a gear provided on a back surface of the susceptor 208 while holding the substrate 11 thereon.

The susceptor 208, the pocket 208p, and the rotating mechanism 216 are preferably constituted of carbon or a carbon coated with SiC, boron nitride (BN), etc., and other members of the HVPE apparatus 200 are preferably constituted of a high-purity quartz containing less impurities. Further, members provided in a region exposed particularly to a high temperature of 1300° C. or more, are preferably constituted of alumina instead of high-purity quartz.

A gas supply pipe 232b for supplying hydrogen chloride (HCl) gas into the film-forming chamber 201, a gas supply pipe 232c for supplying ammonia ($NH_3$) gas into the film-forming chamber 201, and a gas supply pipe 232d for supplying $H_2$ gas, $N_2$ gas, or HCl gas into the film-forming chamber 201, are connected to one end of the airtight container 203. Flow rate controllers 241b to 241d, and valves 243b to 243d, are respectively provided to the gas supply pipes 232b to 232d in this order from an upstream side. A gas generator 233b is provided on a downstream of the gas supply pipe 232b, for housing solid Al as a raw material. A nozzle 249b is connected to the gas generator 233b, for supplying aluminum chloride (AlCl or $AlCl_3$) gas as a film-forming gas generated by a reaction between HCl gas and Al toward the substrate 11 held on the susceptor 208, etc. Nozzles 249c and 249d are respectively connected to downstream sides of the gas supply pipes 232c and 232d, for supplying film-forming gases supplied from these gas supply pipes toward the substrate 11 held on the susceptor 208, etc. Nozzles 249b to 249d are provided so that gases flow toward the front surface of the substrate 11 placed obliquely to a gas flow.

In contrast, an exhaust pipe 230 is provided on the other end of the airtight container 203, for exhausting an inside of the film-forming chamber 201. A pump 231 (or a blower) is provided on the exhaust pipe 230. A zone heater 207 is provided on an outer periphery of the airtight container 203, for heating an inside of the gas generator 233b, the substrate 11 held on the susceptor 208, etc., to a desired temperature. A temperature sensor 209 is provided in the airtight container 203, for measuring a temperature in the film-forming chamber 201. A temperature of the zone heater 207 (referred to as A1 in the figure) located around the gas generator 233b is maintained at a temperature of 600 to 800° C. or 400 to 600° C., to thereby generate AlCl gas or $AlCl_3$ gas by the reaction between HCl gas and Al. Further, a temperature of the zone heater 207 (referred to as A3 in the figure) located around the susceptor 208 is maintained at a temperature suitable for a growth described later.

Each member of the HVPE apparatus 200 is connected to a controller 280 configured as a computer, and is configured so that processing procedures and processing conditions described later are controlled by a program executed by the controller 280.

The HVPE apparatus 200 may include a gas supply pipe 232a for supplying HCl gas into the film-forming chamber 201, a flow rate controller 241a, a valve 243a, a gas generator 233a for housing gallium (Ga) melt or indium (In) melt as a raw material, a nozzle 249a, etc., in addition to the abovementioned each member, and may be constituted so that gallium chloride (GaCl) gas or indium chloride (InCl) gas as the film-forming gas generated by a reaction between HCl gas, and Ga melt or In melt is supplied toward the substrate 11 held on the susceptor 208, etc. Furthermore, the HVPE apparatus 200 may include separate gas generators for housing Ga melt and In melt respectively, and may be constituted so that GaCl gas and InCl gas can be supplied respectively independently.
(An Outline of a Manufacturing Procedure)

Subsequently, an explanation will be given for an example of a manufacturing procedure of a nitride semiconductor template using the HVPE apparatus 200 having abovementioned constitution, in a case that the nitride semiconductor is AlN. Hereafter, the template 10 in a case that AlN is used for the nitride semiconductor, is referred to as "an AlN-template 10".

Figure 3:
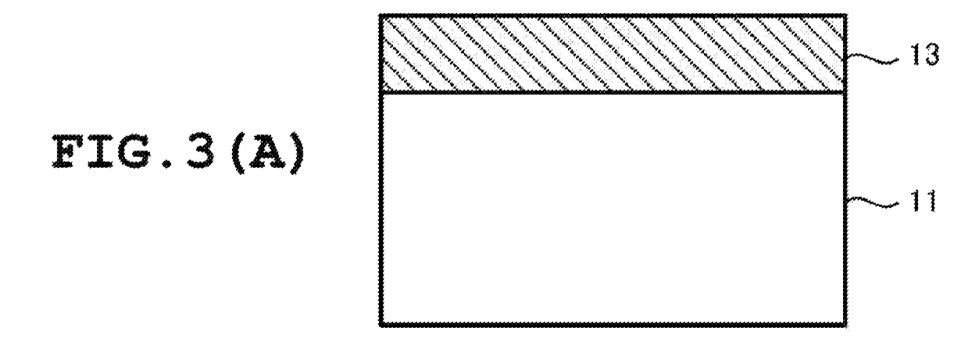
FIG. 3A and FIG. 3B are respectively cross-sectional views showing an outline of a manufacturing procedure of the nitride semiconductor template according to an embodiment of the present disclosure.

FIG. 3A and FIG. 3B are respectively cross-sectional views showing an outline of the manufacturing procedure of the nitride semiconductor template of this embodiment.

The manufacturing of the AlN-template 10 is performed through a substrate preparing step (step 1, step is abbreviated to "S" hereafter), a first layer forming step (S2), an annealing step (S3), and a second layer forming step (S4).
(S1: Substrate Preparing Step)

In the substrate preparing step (S1), the substrate 11 to be processed by the HVPE apparatus 200, namely, the substrate for constituting the AlN-template 10, is prepared. Specifically, a sapphire substrate is prepared as the substrate 11, with a surface inclined by 0.1° to 3° in a-axis direction or m-axis direction from C-plane used as the front surface, for example. An optimum growth condition of the AlN film is slightly changed in some cases, depending on an off-direction of the substrate 11. Therefore, it is effective that the off-direction of the substrate 11 to be used is kept constant in order to enhance a reproducibility. When an off-angle of the substrate 11 is less than 0.1°, the following situation is generated; an accuracy of the off-direction becomes low in a stage of polishing the sapphire substrate, and each substrate 11 has a different off-direction. Therefore, it is preferable to avoid the substrate 11 having such a small off-angle. Further, when the off-angle is more than 3°, huge steps are often formed on the front surface of the finally obtained AlN-template 10. Therefore, it is preferable to avoid the substrate 11 having such a large off-angle.

One of substrates having a size with a diameter of 2 to 8 inches is selected as the substrate 11. The term "size with a diameter" here may be an actual inch-size, and may be a size which is used conventionally such as "2 inches"=50 mm, "6 inches"=150 mm.

(S2: First Layer Forming Step)

Next, the first layer forming step (S2) is performed after the substrate preparing step (S1). In the first layer forming step (S2), first, the substrate 11 prepared in the substrate preparing step (S1), is placed on the susceptor 208 of the HVPE apparatus 200, with its front surface as an upper side.

Further, in the HVPE apparatus 200, solid Al as the raw material is housed in the gas generator 233b. Then, the susceptor 208 is rotated, and $H_2$ gas (or a mixed gas of $H_2$ gas and $N_2$ gas) is supplied from the gas supply pipe 232d into the film-forming chamber 201 while heating and exhausting the inside of the film-forming chamber 201. Thereafter, in a state in which a temperature, a pressure, and an atmosphere in the film-forming chamber 201 reaches a desired growth temperature, a desired growth pressure, and a desired atmosphere, gases are supplied from the gas supply pipes 232b and 232c, and then AlCl gas or $AlCl_3$ gas, and $NH_3$ gas are supplied as the film-forming gases toward the front surface of the substrate 11 placed obliquely to a gas flow. These film-forming gases can also be supplied together with a carrier gas composed of $H_2$ gas, $N_2$ gas, or a mixed gas of them.

As a result, as shown in FIG. 3A, the layer 13 is formed by epitaxially growing AlN on the front surface side of the substrate 11 by the vapor phase growth. Thus, by forming the layer 13 by an epitaxial growth of the vapor phase growth, there is an advantage in terms of increasing the diameter of the AlN-template 10 (realizing the large substrate having a diameter of 2 inches or more for example) and ensuring the transparency, as compared with a case of forming the layer 13 by the sublimation method.

The substrate 11 for forming the layer 13 thereon has the front surface formed into a mirror surface, and does not have a concavo-convex pattern on its front surface. Therefore, in forming the layer 13, a void due to the concavo-convex pattern on the front surface of the substrate 11 does not exist between the substrate 11 and the layer 13.

The layer 13 is formed so that the layer 13 has the thickness of forming the layer 13 as a continuous film and not allowing cracks to be generated in the layer 13. Specifically, for example, the layer 13 is formed so that the layer 13 have the thickness of 100 to 800 nm, particularly 200 to 800 nm, as already described.

Further, in the first layer forming step (S2), the layer 13 is formed under a condition that the layer 13 is crystallized (namely, in a non-amorphous state) at the time of completion of growth in the abovementioned thickness (namely, in an as-grown state before annealing). Specifically, for example, the layer 13 is formed by heating using the zone heater 207 (referred to as A3 in FIG. 2) so that the temperature near the susceptor 208 of the HVPE apparatus 200 is maintained at a growth temperature of 1000 to 1300° C. Then, the AlN film for forming the layer 13 is grown by adjusting a supply amount of AlCl gas or $AlCl_3$ gas, and $NH_3$ gas so that a growth rate is 0.5 to 500 nm/minute. A ratio of a supply amount of N-source to Al-source (a so-called V/III ratio) is set as 0.2 to 200. At this time, HCl gas may flow from the nozzle 249d in order to prevent a parasitical adhesion of AlN on the nozzles 249a to 249d, and an amount of HCl gas is set as a ratio of 0.1 to 100 with respect to AlCl gas or $AlCl_3$ gas.

In the layer 13 thus formed, the RMS on the front surface is for example about 0.3 to 10 nm at the time of completion of growth (namely, in the as-grown state before annealing). Further, the layer 13 has the polarity in the growth direction. For example, in the layer 13, the substrate 11—side surface is N-polarity plane, and an almost entire surface on the opposite side thereof (namely, the front surface of the layer 13) is Al-polarity plane which is the group-III polarity plane.

(S3: Annealing Step)

Incidentally, since the layer 13 is formed to be thin in a thickness of not generating cracks, there is a concern that the dislocation density of the layer 13 is increased at the time of completion of growth (namely, in the as-grown state before annealing). Therefore, the annealing step (S3) is performed in order to improve the quality of the thin layer 13 (to obtain the high-quality thin layer 13) on the substrate 11 after the first layer forming step (S2).

In the annealing step (S3), supplies of AlCl gas or $AlCl_3$ gas, $NH_3$ gas, and $H_2$ gas into the film-forming chamber 201 of the HVPE apparatus 200 are stopped, and $N_2$ gas is supplied from all gas supply pipes, and thereby the atmosphere in the film-forming chamber 201 is replaced with $N_2$ gas. After the atmosphere in the film-forming chamber 201 becomes $N_2$ gas atmosphere, a temperature near the susceptor 208 is elevated to a desired annealing temperature using the zone heater 207 (referred to as A3 in FIG. 2) while rotating the susceptor 208 and exhausting the inside of the film-forming chamber 201. Thus, in the annealing step (S3), annealing is applied to the layer 13 formed on the substrate 11 in $N_2$ gas atmosphere, without unloading the substrate 11 from the inside of the film-forming chamber 201 of the HVPE apparatus 200. Namely, annealing is applied to the layer 13 in $N_2$ gas atmosphere which is an atmosphere not containing AlCl gas or $AlCl_3$ gas, $NH_3$ gas, and $H_2$ gas. By thus applying annealing in $N_2$ gas atmosphere, the mixture of impurities such as C and O into the layer 13 during annealing can be suppressed, and annealing using the same HVPE apparatus 200 used in the first layer forming step (S2) can also be realized.

Annealing applied in the annealing step (S3) is a treatment for improving a quality of a front surface state of the layer 13 (particularly, a state relating to the dislocations). Therefore, in the annealing step (S3), it is preferable to apply annealing under a condition that the average dislocation density on the front surface of the layer 13 after annealing becomes $1 \times 10^9$ numbers/$cm^2$ or less. Further, in the annealing step (S3), annealing is applied under a condition that the half-value width of (10-12) diffraction obtained by XRC measurement for the front surface of the layer 13 after annealing becomes 600 seconds or less, more preferably 400 seconds or less. This means that annealing is applied under a condition that edge dislocations in the layer 13 are mainly reduced in the annealing step (S3). The case that the average dislocation density is $1 \times 10^9$ numbers/$cm^2$ or less, means that the half-value width of (10-12) diffraction obtained by XRC measurement is approximately 400 seconds or less.

Figure 4A:
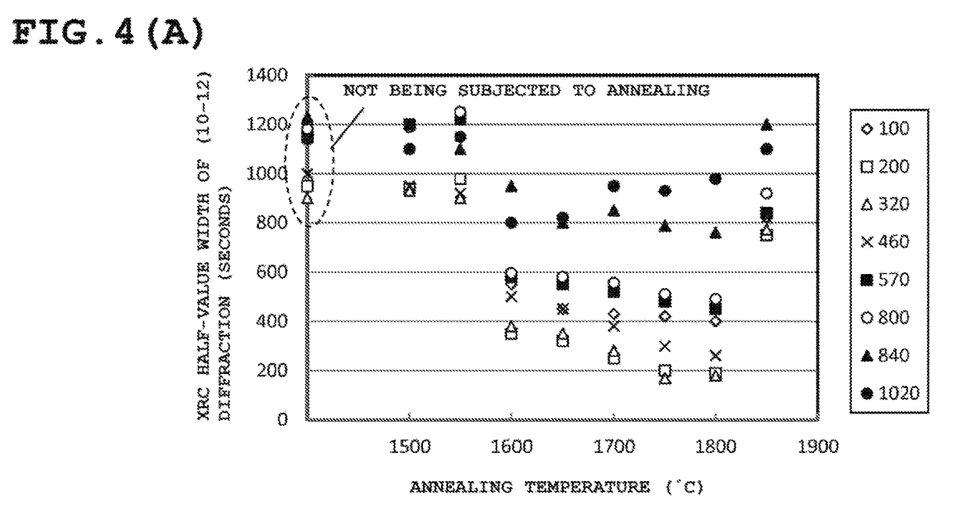
FIG. 4A and FIG. 4B are respectively explanation views showing a specific example of a relation between an annealing condition and a state of dislocations on a front surface of an AlN film constituting a first layer in the nitride semiconductor template according to an embodiment of the present disclosure.
Figure 4B:
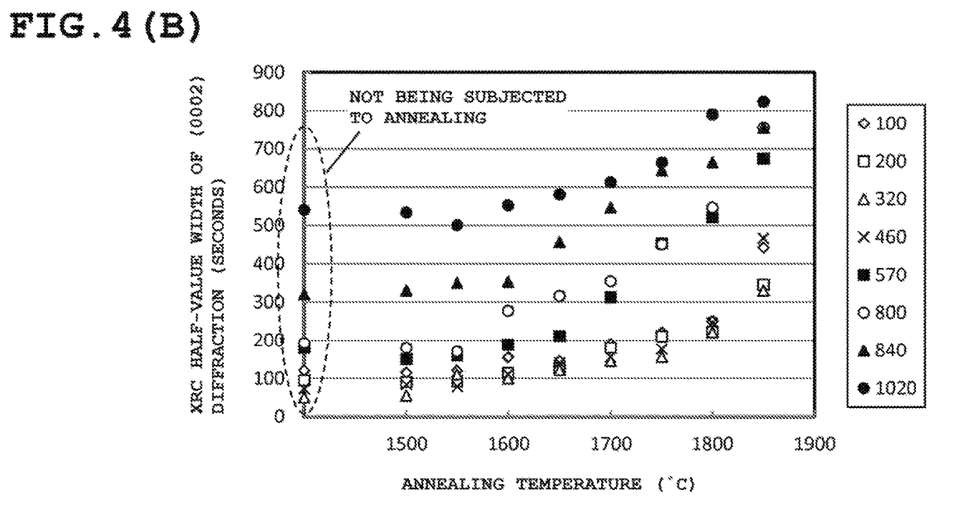

As shown in FIGS. 4A and 4B for example, a state relating to the dislocations (for example, the edge dislocations and screw dislocations) on the front surface of an AlN layer after annealing, depends on a processing temperature (an annealing temperature) when annealing is applied.

FIGS. 4A and 4B are respectively explanation views showing a specific example of a relation between a state of dislocations on the front surface of the AlN film constituting the first layer and the annealing conditions.

The examples of FIG. 4A show specific examples of a relation between a half-value width of (10-12) diffraction obtained by XRC measurement using the XRD apparatus (namely, measurement results of both the edge dislocations and the screw dislocations) and an annealing temperature. The examples of FIG. 4B show specific examples of a relation between a half-value width of (0002) diffraction obtained by the same XRC measurement (namely, measurement results of the screw dislocations) and the annealing temperature. Specifically, the examples of FIGS. 4A and 4B show results obtained by XRC measurement for a wafer having a thickness of the layer 13 being one of 100 nm, 200 nm, 320 nm, 460 nm, 570 nm, 800 nm, 840 nm, and 1020 nm, in a case of not being subjected to annealing and after being taken out from the apparatus 200 before growing the layer 14, or in a case of being subjected to annealing at the annealing temperature of 1500 to 1850° C. for an annealing time of one hour and after being taken out from the apparatus 200 immediately after annealing namely before growing the layer 14.

According to the measurement results shown in FIG. 4A and FIG. 4B, in the case of not applying annealing at all, the average dislocation density on the front surface of the layer 13 is equal to or larger than about $1\times10^{10}$ numbers/cm$^2$ of the conventional AlN film, and although the half-value width of (0002) diffraction is a small value of about 100 seconds, the half-value width of (10-12) diffraction is a large value of about 1000 seconds.

In contrast, in the case of applying annealing, the half-value width obtained by XRC measurement (also referred to as an XRC half-value width) is changed by annealing particularly at 1600° C. or more. Namely, by applying annealing at 1600° C. or more, the half-value width of (0002) diffraction obtained by XRC measurement is increased and the half-value width of (10-12) diffraction is decreased, as compared with the case of not applying annealing.

Particularly, when the half-value width of (10-12) diffraction is focused, the half-value width is remarkably decreased when the annealing temperature is in a rage of 1600 to 1800° C. Especially, the half-value width of (10-12) diffraction is a small value of 600 seconds or less, when the thickness of the layer 13 is 800 nm or less. Further, the half-value width of (10-12) diffraction is 400 seconds or less, when the annealing temperature is in a range of 1600 to 1800° C. in a case that the thickness of the layer 13 is 320 nm or less, or when the annealing temperature is in a range of 1720 to 1800° C. in a case that the thickness of the layer 13 is 460 nm. Under this condition, it is conceivable that the dislocation density of the layer 13 is $1\times10^9$ numbers/cm$^2$ or less when the half-value width of (10-12) diffraction is converted to the dislocation density. The half-value width of (10-12) diffraction is deteriorated to 700 seconds or more when the annealing temperature is 1850° C. or more. It is conceivable that the dislocation density is changed to an increase reversely, as a result of the excessively high annealing temperature.

Almost the same result can be obtained in a case that the annealing time is changed in a range of 30 to 180 minutes.

As described above, in order to realize the abovementioned high-quality layer 13, the annealing step (S3) is performed under the following specific conditions: the thickness of the layer 13 is in a range of 100 to 800 nm, the annealing temperature is in a range of 1600 to 1800° C., and the annealing time is in a range of 30 to 180 minutes, for example.

When the thickness of the layer 13 is less than 100 nm, the front surface of the layer 13 is not flattened after being grown, and the layer 13 is peeled off by etching sapphire of the substrate 11 during annealing. Therefore, a high-quality film is hardly obtained. Further, when the thickness of the layer 13 is more than 800 nm, as shown in FIG. 4B, the half-value width of (0002) diffraction obtained by XRC measurement is hardly 600 seconds or less. This is a phenomenon supporting an idea that the dislocations are reduced by relatively freely moving the constituent atoms of AlN during annealing when the thickness of the layer 13 is small. Namely, it is possible to explain the following matter: the quality of the AlN film is hardly improved in a case of the large thickness of the layer 13, probably due to a situation in which degree of freedom of the constituent atoms in AlN is relatively decreased.

When annealing is applied at a temperature of less than 1600° C., an effect by annealing cannot be sufficiently obtained, thereby involving a possibility that the quality of the front surface state of the layer 13 cannot be improved. Meanwhile, annealing at a temperature of 1850° C. or more results in an excessive annealing, and results in a situation that an improvement of the quality of the front surface state of the layer 13 is rather hindered.

This is also applied to the annealing time. Namely, when annealing is applied for less than 30 minutes, the effect by annealing cannot be sufficiently obtained, thereby involving a possibility that the quality of the front surface state of the layer 13 cannot be improved. Meanwhile, annealing for more than 180 minutes results in the excessive annealing, and results in a situation that the improvement of the quality of the front surface state of the layer 13 is rather hindered.

Incidentally, in the annealing step (S3), the front surface of the layer 13 is deteriorated when annealing is applied under a condition that the quality of the AlN film can be sufficiently improved. Specifically, the front surface of the layer 13 before annealing and after annealing, is sometimes changed as follows.

For example, regarding the RMS on the front surface of the layer 13, the RMS after the annealing step (S3) is larger than the RMS after the first layer forming step (S2) and before the annealing step (S3). Specifically, above each RMS is changed as follows: the RMS on the front surface of the layer 13 after the first layer forming step (S2) and before the annealing step (S3) is 0.3 to 10 nm, and meanwhile the RMS on the front surface of the layer 13 after the annealing step (S3) is 1 to 50 nm.

Further, for example, regarding a half-value width of (0002) diffraction or (0004) diffraction obtained by XRC measurement for the front surface of the layer 13, the value after the annealing step (S3) is larger than the value after the first layer forming step (S2) and before the annealing step (S3). Specifically, as shown in FIG. 4B, above each value is changed between before and after annealing as follows. Namely, the half-value width of (0002) diffraction or (0004) diffraction obtained by XRC measurement for the front surface of the layer 13 after the first layer forming step (S2) and before the annealing step (S3) is 50 to 200 seconds, when the thickness of the layer 13 is at least 800 nm or less. In contrast, the half-value width of (0002) diffraction or (0004) diffraction obtained by XRC measurement for the front surface of the layer 13 after the annealing step (S3) is 100 to 600 seconds, at the annealing temperature of 1600 to 1800° C.

It is generally considered that an increase of the half-value width of (0002) diffraction or (0004) diffraction indicates an increase of an edge dislocation density. However, this is a discussion mainly in a case of a crystal when a front surface is flattened. A different discussion is possible in a case that the front surface is roughened. Namely, when the front surface is roughened, an additional degree of freedom occurs in an atom position on the front surface or a direction of a lattice plane even when the dislocations do not existed. Therefore, the half-value width of (0002) diffraction or (0004) diffraction is measured to be large in some cases. Accordingly, when the annealing temperature is at least in a range of 1800° C. or less, it is conceivable that the increase of the half-value width of (0002) diffraction shown in FIG. 4B, is not caused by an increase of the dislocation density of the layer 13, but is caused by roughness on the front surface. The following matter also supports this reasoning (the dislocation density after annealing is not increased): namely, the half-value width of (0002) diffraction is recovered almost to the same level as before annealing in a case of flattening the front surface of the layer 14 even when it is grown on the layer 13 only by several 100 nm after annealing as described later.

Thus, the deteriorations such as roughness of the front surface occur in the layer 13, when annealing is applied in $N_2$ gas atmosphere to an extent that the dislocations in the layer 13 are reduced. Therefore, conventionally, annealing has not been applied in $N_2$ gas atmosphere.

However, it is found by the present inventors that even when the front surface of the layer 13 is deteriorated by applying annealing in $N_2$ gas atmosphere, an additional AlN film is grown on the roughened surface under a prescribed condition as described later, and thereby the roughened surface can become a mirror surface, and further a dislocation density on the re-growing surface can become $1 \times 10^9$ numbers/cm$^2$ or less in the best condition of the layer 13. Therefore, the second layer forming step (S4) for growing the layer 14 so as to overlap on the layer 13 under a prescribed condition, is performed after the annealing step (S3).

(S4: Second Layer Forming Step)

In the second layer forming step (S4), the susceptor 208 is rotated, and $H_2$ gas (or the mixed gas of $H_2$ gas and $N_2$ gas) is supplied from the gas supply pipe 232*d* into the film-forming chamber 201 while heating and exhausting the inside of the film-forming chamber 201, without unloading the substrate 11 with the layer 13 formed thereon from the inside of the film-forming chamber 201 of the HVPE apparatus 200. Thereafter, in a state in which a temperature, a pressure, and an atmosphere in the film-forming chamber 201 reaches a desired growth temperature, a desired growth pressure, and a desired atmosphere, gases are supplied from the gas supply pipes 232*b* and 232*c*, and then AlCl gas or AlCl$_3$ gas, and NH$_3$ gas are supplied as the film-forming gases toward the front surface of the substrate 11 placed obliquely to a gas flow. These film-forming gases can also be supplied together with the carrier gas composed of $H_2$ gas, $N_2$ gas, or the mixed gas of them.

Thereby, as shown in FIG. 3B, the layer 14 is formed by epitaxially growing AlN on the front surface of the layer 13 by the vapor phase growth. Thus, by forming the layer 14 by the epitaxial growth of the vapor phase growth, a crystal structure of the layer 14 is formed based on a crystal structure of the layer 13. Namely, since the dislocations in the layer 13 are reduced, the low-dislocation layer 14 is also formed on the layer 13. Specifically, for example, since the average dislocation density on the front surface of the layer 13 after annealing is $1 \times 10^9$ numbers/cm$^2$ or less in the best condition of the layer 13, the average dislocation density on the front surface of the layer 14 formed on the layer 13 is also $1 \times 10^9$ numbers/cm$^2$ or less in the best condition of the layer 14. Further, the entire front surface of the layer 14 becomes Al-polarity plane which is the group-III polarity plane, by growing the layer 14.

The layer 14 is formed so that the thickness of the layer 14 is 100 nm to 20 μm. Since the layer 14 is formed on the layer 13 in which the dislocations are reduced, cracks are hardly generated even when the layer 14 is thus formed thick. When there are many dislocations in the base layer, the base layer is similarly in a state of including many cleavages inside of the base layer. Therefore, a layer to be formed thereon becomes weak against a stress, and is easily broken. In contrast, when the low-dislocation layer such as the layer 13 is used as the base, the weak part in the layer 14 to be formed on the layer 13 is reduced, and therefore the layer 14 is hardly broken. Namely, the layer 14 formed on the layer 13, is formed as the crack-free layer (a layer in which cracks do not exist), even when the layer 14 is formed to have a thickness of possibly generating cracks, for example the thickness of 3 μm or more.

Further, in the second layer forming step (S4), the layer 14 is formed by heating using the zone heater 207 (referred to as A3 in FIG. 2) so that the temperature near the susceptor 208 of the HVPE apparatus 200 is maintained at a growth temperature of 1000 to 1600° C., more preferably 1400 to 1600° C. Then, the AlN film for forming the layer 14 is grown by adjusting a supply amount of AlCl gas or AlCl$_3$ gas, and NH$_3$ gas so that a growth rate is 0.5 to 500 nm/minute. A ratio of a supply amount of N-source to Al-source (a so-called V/III ratio) is set as 0.2 to 200. At this time, HCl gas may flow from the nozzle 249*d* in order to prevent the parasitical adhesion of AlN on the nozzles 249*a* to 249*d*, and an amount of HCl gas is set as a ratio of 0.1 to 100 with respect to AlCl gas or AlCl$_3$ gas.

In the layer 14 thus formed, the RMS on the front surface is for example 10 nm or less, more preferably 1 nm or less.

Namely, even in a case that the front surface of the layer 13 is deteriorated, the front surface of the layer 14 can be a mirror surface when the layer 14 to be formed so as to overlap on the front surface of the layer 13 is grown at a growth temperature of 1000 to 1600° C., particularly 1400 to 1600° C. in a thickness of 100 nm or more, based on an assumption that the dislocations in the layer 13 are reduced. Furthermore, the dislocation density on the front surface of the layer 14 can be $1 \times 10^9$ numbers/cm$^2$ or less in the best condition of the layer 14.

Figure 5A:
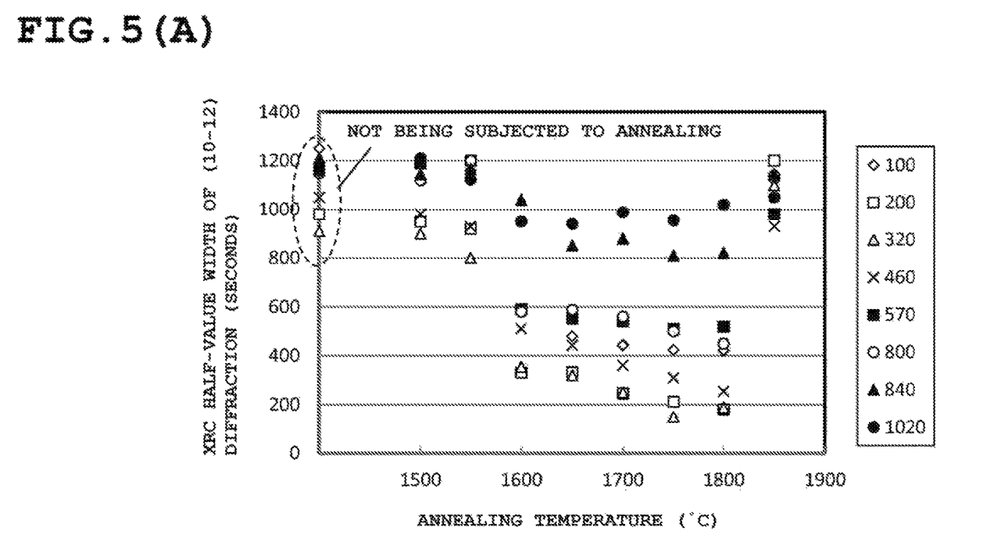
FIG. 5A and FIG. 5B are respectively explanation views showing a specific example of a relation between an annealing condition and a state of dislocations on a front surface of an AlN film constituting a second layer in the nitride semiconductor template according to an embodiment of the present disclosure.
Figure 5B:
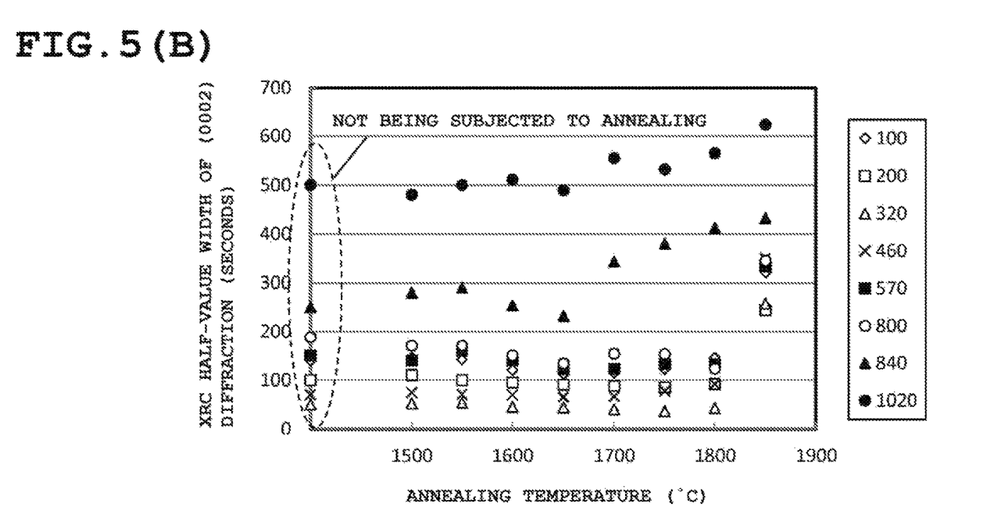

FIG. 5A and FIG. 5B are respectively explanation views showing a specific example of a relation between a state of the dislocations on the front surface of the AlN film constituting the second layer and the annealing condition. Namely, the examples of FIG. 5A show specific examples of a relation between the half-value width of (10-12) diffraction obtained by XRC measurement (namely, measurement results of both the edge dislocations and the screw dislocations) and the annealing temperature. The examples of FIG. 5B show specific examples of a relation between the half-value width of (0002) diffraction obtained by the same XRC measurement (namely, measurement results of the screw dislocations) and the annealing temperature.

The examples of FIGS. 5A and 5B show an XRC half-value width measured after the layer 14 having a thickness of 300 nm is grown on the layer 13. More specifically, the examples of FIGS. 5A and 5B show results obtained by XRC measurement for the layer 14 formed on the layer 13 in a thickness of 300 nm, the layer 13 having a thickness of one of 100 nm, 200 nm, 320 nm, 460 nm, 570 nm, 800 nm, 840 nm, and 1020 nm, in a case of not being subjected to annealing, or in a case of being subjected to annealing at the annealing temperature of 1500 to 1850° C. for an annealing time of one hour.

According to the measurement results shown in FIG. 5A, when the annealing temperature of the layer 13 is in a range of 1600 to 1800° C. and the thickness of the layer 13 is 800 nm or less, the half-value width of (10-12) diffraction obtained by XRC measurement for the front surface of the layer 14 is 600 seconds or less. Further, according to the measurement results shown in FIG. 5B, the half-value width of (0002) diffraction under the above conditions is 200 seconds or less, and it is found that both the edge dislocations and the screw dislocations are suppressed low under these conditions.

Particularly, when the half-value width of (10-12) diffraction is focused, the half-value width of (10-12) diffraction obtained by XRC measurement is 400 seconds or less, and the dislocation density is $1 \times 10^9$ numbers/$cm^2$ or less, in a case that the annealing temperature is in a range of 1600 to 1800° C. and the thickness of the layer 13 is 320 nm or less, and in a case that the annealing temperature is in a range of 1700 to 1800° C. and the thickness of the layer 13 is 460 nm.

Almost the same result can be obtained in a case that the thickness of the layer 14 is changed in a range of 100 nm to 20 μm.

(Flow from S2 to S4)

As described above, in manufacturing the AlN-template 10 in this embodiment, the first layer forming step (S2), the annealing step (S3), and the second layer forming step (S4) are continuously performed using the HVPE apparatus 200 which is the same growth apparatus. Namely, the second layer forming step (S4) is performed without a polishing step of polishing the layer 13 after the annealing step (S3), because the abovementioned steps of S2 to S4 is performed continuously.

Therefore, it is not necessary to prepare the annealing apparatus capable of flowing CO-gas separately from the growth apparatus, unlike the method disclosed in non-patent document 1 for example. Furthermore, since annealing is applied in $N_2$ gas atmosphere, the mixture of impurities such as C and O into particularly the layer 14 which is an upper layer can be suppressed, and annealing using the same HVPE apparatus 200 that performs the vapor phase growth can also be realized.

(Manufactured Product)

The AlN-template 10 of this embodiment as shown in FIG. 1 is manufactured, through the abovementioned steps S1 to S4 respectively.

Such an AlN-template 10 is obtained as follows: the layer 13 is grown on the substrate 11, and thereafter annealing is applied at a temperature of 1600 to 1800° C. in $N_2$ gas atmosphere, and then the layer 14 is grown on the layer 13 at a growth temperature of 1000 to 1600° C., particularly 1400 to 1600° C. in a thickness of 100 nm or more. Thereby, the front surface of the layer 14 is formed into the mirror surface and the dislocations of the layer 14 are reduced. Namely, such an AlN-template 10 having a surface quality and a crystal quality equal to or higher qualities than conventional products due to a method disclosed in non-patent document 1 for example, is realized only by the HVPE apparatus 200 (namely, by simple apparatus configuration not requiring the annealing apparatus, etc., separately from the growth apparatus).

Further, in such an AlN-template 10, the layer 13 and the layer 14 are continuously formed using the same HVPE apparatus 200. However, since there is an increased dislocation density in AlN when the layer 13 is grown, a large amount of oxygen is taken in the layer 13 by diffusion from the substrate 11—side during growth or by mixing from a growth atmosphere. The oxygen concentration is about $1 \times 10^{18}$ to $1 \times 10^{21}$/$cm^3$. The oxygen concentration of the layer 13 is almost the same as a layer grown using the conventional method, because the layer 13 itself is grown by a conventionally used method. In contrast, the quality of the layer 13 to be a base is improved (dislocations in the layer 13 are reduced) by annealing at a start of the growth of the layer 14, and therefore the layer 14 is also a low-dislocation AlN. Therefore, although oxygen is slightly diffused from the layer 13 during the growth of the layer 14, the taking-in of oxygen is suppressed as a whole. Although the oxygen concentration of the layer 14 depends on the atmosphere in the HVPE apparatus 200, it is typically $1 \times 10^{18}$/$cm^3$ or less.

The AlN-template 10 thus obtained is used for example when a semiconductor device such as LED is manufactured. Namely, the nitride semiconductor device can be constituted by laminating at least one of an n-typed film, a p-typed film, and an undoped film, namely, by forming a nitride semiconductor lamination structure by growing nitride semiconductor containing Al. Such a nitride semiconductor device can realize a schottky diode, a pn-junction diode, a light-emitting diode, or a transistor, for example.

(3) Effect Obtained by this Embodiment

According to this embodiment, one or more of the following effects can be obtained.
(a) According to this embodiment, the AlN layer 12 of the AlN-template 10 is constituted of the two-layer structure of the layer 13 and the layer 14, annealing is applied to the layer 13 in $N_2$ gas atmosphere, and thereafter the layer 14 is re-grown on the layer 13. Thereby, a high-quality AlN-template 10 can be obtained efficiently.
(b) In the AlN-template 10 of this embodiment, the AlN layer 12 on the substrate 11 has the two-layer structure of the layer 13 and the layer 14, and both the layer 13 and the layer 14 are formed by the epitaxial growth of the vapor phase growth. Therefore, there is an advantage in terms of increasing the diameter of the AlN-template 10 and ensuring the transparency, as compared with a case of forming the AlN layer 12 by the sublimation method.
(c) Further, in the AlN-template 10 of this embodiment, the dislocations in the layer 13 can be reduced because annealing is applied to the layer 13. In addition, since the dislocations in the layer 13 are reduced, the low-dislocation layer 14 is also formed on the layer 13. Namely, in the AlN-template 10 of this embodiment, it is not necessary to grow the thick AlN for reducing the dislocations because a low-dislocation AlN layer 12 is achieved by applying annealing to the layer 13. Therefore, the AlN layer 12 in which the dislocations of the front surface are reduced, can be achieved even when the thickness (a total thickness of the layer 13 and the layer 14) is small as compared with a case of not undergoing annealing, and a risk of generating cracks in the AlN layer 12 can be reduced.

In addition, since the layer 14 is formed on the layer 13 in which the dislocations are reduced, cracks are hardly generated even when the layer 14 is formed thick. When there are many dislocations in a base layer, the base layer is similarly in a state of including many cleavages inside of the base layer. Therefore, a layer to be formed on the base layer becomes weak against a stress, and is easily broken. In contrast, when the low-dislocation layer such as the layer 13 is used as a base, a weak part in the layer 14 to be formed on the layer 13 is reduced, and therefore the layer 14 is hardly broken.

(d) Further, in the AlN-template 10 of this embodiment, annealing is applied to the layer 13 in $N_2$ gas atmosphere, the mixture of impurities such as C and O can be suppressed, and it is possible to solve a concern that the purity of the AlN film to be grown is deteriorated.

In addition, annealing can be applied using the same HVPE apparatus 200 for growing the AlN film, as long as annealing is applied in $N_2$ gas atmosphere. Therefore, it is not necessary to prepare the annealing apparatus separately from the HVPE apparatus 200. Namely, the first layer forming step (S2), the annealing step (S3), and the second layer forming step (S4) can be continuously performed using the HVPE apparatus 200 in manufacturing the AlN-template 10, and therefore the AlN-template 10 can be manufactured extremely efficiently.

(e) The deteriorations such as roughness of the front surface occur in the layer 13, when annealing is applied in $N_2$ gas atmosphere to an extent that the dislocations in the layer 13 are reduced. Therefore, conventionally, annealing has not been applied in $N_2$ gas atmosphere. However, in this embodiment, even when the front surface of the layer 13 is deteriorated by applying annealing in $N_2$ gas atmosphere, the front surface of the layer 14 can be the mirror surface, and the average dislocation density of the front surface of the layer 14 (namely, the front surface of the AlN layer 12) can be $1 \times 10^9$ numbers/cm$^2$ or less, because the layer 14 is formed (namely, the additional AlN film is grown) on the roughened front surface under a prescribed condition. Namely, the layer 14 having a flattened front surface can be grown on the layer 13 in which the dislocations are reduced by annealing, even when the front surface of the layer 13 is roughened by annealing. Thereby, the high-quality AlN-template 10 can be obtained.

Other Embodiment

As described above, explanation has been given specifically for an embodiment of the present disclosure. However, the present disclosure is not limited thereto, and can be variously modified in a range not departing from the gist of the disclosure.

In the abovementioned embodiment, explanation has been given for an example of a case that the nitride semiconductor is AlN, namely in a case that the layer 13 and the layer 14 are made of AlN. However, the present disclosure is not limited thereto. The layer 13 and the layer 14 may be made of the nitride semiconductor containing Al, for example, AlN, AlInN, AlGaN, or AlInGaN which are represented by $In_{1-x-y}Al_xGa_yN$ ($0 \leq x+y \leq 1$, $0 < x \leq 1$, $0 \leq y \leq 1$), respectively. In this case as well, similar results as the example of the abovementioned embodiment can be obtained.

Further, in the abovementioned embodiment, explanation has been given for an example of a case that annealing is applied in $N_2$ gas atmosphere in the annealing step (S3). However, the present disclosure is not limited thereto. Namely, annealing in the annealing step (S3) may be applied using an inert gas such as argon, helium for example different from $N_2$ gas instead of $N_2$ gas, as long as annealing is applied to the layer 13 in an atmosphere not containing GaCl gas, GaCl$_3$ gas, AlCl gas, AlCl$_3$ gas, InCl gas, InCl$_3$ gas, HCl gas, Cl$_2$ gas, NH$_3$ gas, and H$_2$ gas. In this case as well, similar technical effects as the case of the abovementioned embodiment can be obtained.

Further, in the abovementioned embodiment, explanation has been given for a case that the substrate 11 is a sapphire substrate. However, the present disclosure is not limited thereto. For example, the substrate 11 may be SiC substrate, etc. However, when the substrate 11 is SiC substrate, an optimum annealing temperature in the annealing step (S3) is in a range of 1600 to 2000° C.

Further, the front surface of the substrate 11 is not limited to C-plane, and may be R-plane, A-plane, or M-plane, or may be a surface inclined by 0.1 to 3° from these planes.

Further, in the abovementioned embodiment, explanation has been given for a case that gases flow toward the front surface of the substrate 11 placed obliquely to a gas flow in the HVPE apparatus 200. However, gases may flow in a direction along the main surface (in a direction parallel to the main surface) of the substrate 11, or in a direction perpendicular to the main surface of the substrate 11.

Further, in the abovementioned embodiment, explanation has been given for an example of a case that the template 10 is manufactured using the HVPE apparatus 200. However, the present disclosure is not limited thereto. Namely, the growth apparatus used for manufacturing the template 10 may be other vapor phase growth apparatus such as a MOVPE apparatus, or a growth apparatus used in a method other than the vapor phase growth method such as sputtering method or sodium flux method, as long as the layer 13 and the layer 14 can be formed by the epitaxial growth. In this case as well, similar technical effects as the case of the abovementioned embodiment can be obtained.

Further, in the abovementioned embodiment, explanation has been given for an example of the case that the first layer forming step (S2), the annealing step (S3), and the second layer forming step (S4) are performed continuously using the same HVPE apparatus 200. However, the present disclosure is not limited thereto. Namely, all of the first layer forming step (S2), the annealing step (S3), and the second layer forming step (S4) may be performed using different apparatus, or two steps of the abovementioned steps may be performed using the same growth apparatus.

Preferable Aspects of the Present Disclosure

Preferable aspects of the present disclosure will be supplementarily described hereafter.

[Supplementary Description 1]

According to an aspect of the present disclosure, there is provided a method for manufacturing a nitride semiconductor template constituted by forming a nitride semiconductor layer on a substrate, including:

a first layer forming step of forming a first layer by epitaxially growing a nitride semiconductor containing aluminum on the substrate;

an annealing step of applying annealing to the first layer in an inert gas atmosphere; and a second layer forming step of forming a second layer by epitaxially growing a nitride semiconductor containing aluminum on the first layer by a vapor phase growth after the annealing step, and constituting the nitride semiconductor layer by the first layer and the second layer.

[Supplementary Description 2]

Preferably, there is provided the method of the supplementary description 1, wherein a sapphire substrate is used as the substrate, with a surface inclined by 0.1° to 3° in a-axis direction or m-axis direction from C-plane used as a front surface.

[Supplementary Description 3]

Preferably, there is provided the method of the supplementary description 1 or 2, wherein a substrate having a diameter of 2 to 8 inches is used as the substrate.

[Supplementary Description 4]

Preferably, there is provided the method of any one of the supplementary descriptions 1 to 3, wherein a surface roughness RMS on a front surface of the first layer after the annealing step, is larger than a surface roughness RMS on the front surface of the first layer after the first layer forming step and before the annealing step.

A surface roughness RMS is a value obtained by analyzing an image having a size of 5 μm×5 μm using an atomic force microscope.

[Supplementary Description 5]

Preferably, there is provided the method of the supplementary description 4, wherein the surface roughness RMS on the front surface of the first layer after the first layer forming step and before the annealing step, is 0.3 to 10 nm, and the surface roughness RMS on the front surface of the first layer after the annealing step, is 1 to 50 nm.

[Supplementary Description 6]

Preferably, there is provided the method of any one of the supplementary descriptions 1 to 5, wherein annealing is applied under a condition that a half-value width of (0002) diffraction or (0004) diffraction obtained by X-ray rocking curve measurement for the front surface of the first layer after the annealing step, is larger than a half-value width after the first layer forming step and before the annealing step.

[Supplementary Description 7]

Preferably, there is provided the method of the supplementary description 6, wherein the half-value width of (0002) diffraction or (0004) diffraction obtained by X-ray rocking curve measurement for the front surface of the first layer after the first layer forming step, is 50 to 200 seconds, and the half-value width of (0002) diffraction or (0004) diffraction obtained by X-ray rocking curve measurement for the front surface of the first layer after the annealing step, is 100 to 600 seconds.

[Supplementary Description 8]

Preferably, there is provided the method of any one of the supplementary descriptions 1 to 7, wherein in the first layer forming step, the first layer is formed so that the first layer has a thickness of forming the first layer as a continuous film and not allowing cracks to be generated in the first layer.

[Supplementary Description 9]

Preferably, there is provided the method of the supplementary description 8, wherein in the first layer forming step, the first layer is formed so that the thickness of the first layer is 100 to 800 nm.

[Supplementary Description 10]

Preferably, there is provided the method of any one of the supplementary descriptions 1 to 9, wherein in the first layer forming step, the first layer is formed under a condition that the first layer is crystallized (the first layer becomes in a non-amorphous state) at the time of completion of growth (in an as-grown state before annealing).

[Supplementary Description 11]

Preferably, there is provided the method of the supplementary description 10, wherein in the first layer forming step, the first layer is formed at a growth temperature of 1000 to 1300° C.

[Supplementary Description 12]

Preferably, there is provided the method of any one of the supplementary descriptions 1 to 11, wherein in the annealing step, annealing is applied under a condition that an average dislocation density on the front surface of the first layer after the annealing step becomes $1 \times 10^9$ numbers/cm$^2$ or less.

[Supplementary Description 13]

Preferably, there is provided the method template of any one of the supplementary descriptions 1 to 12, wherein in the annealing step, annealing is applied under a condition that a half-value width of (10-12) diffraction obtained by X-ray rocking curve measurement for the front surface of the first layer after annealing becomes 600 seconds or less.

[Supplementary Description 14]

More preferably, there is provided the method of the supplementary description 13, wherein annealing is applied under a condition that the half-value width becomes 400 seconds or less.

[Supplementary Description 15]

Preferably, there is provided the method of any one of the supplementary descriptions 1 to 14, wherein in the annealing step, annealing is applied under a condition that edge dislocations in the first layer are reduced.

[Supplementary Description 16]

Preferably, there is provided the method of any one of the supplementary descriptions 1 to 15, wherein the substrate is a sapphire substrate, and in the annealing step, annealing is applied within a temperature range of 1600 to 1800° C.

[Supplementary Description 17]

Preferably, there is provided the method of any one of the supplementary descriptions 1 to 15, wherein the substrate is SiC substrate, and in the annealing step, annealing is applied within a temperature range of 1600 to 2000° C.

[Supplementary Description 18]

Preferably, there is provided the method of any one of the supplementary descriptions 1 to 17, wherein in the annealing step, annealing is applied for 30 to 180 minutes.

[Supplementary Description 19]

Preferably, there is provided the method of any one of the supplementary descriptions 1 to 18, wherein in the annealing step, annealing is applied in nitrogen gas atmosphere.

[Supplementary Description 20]

Preferably, there is provided the method of any one of the supplementary descriptions 1 to 19, wherein in the annealing step, annealing is applied in an atmosphere not containing hydrogen gas and ammonia gas.

[Supplementary Description 21]

Preferably, there is provided the method of any one of the supplementary descriptions 1 to 20, wherein in the annealing step, annealing is applied using an inert gas (argon, helium, etc.) different from nitrogen gas instead of nitrogen gas.

[Supplementary Description 22]

Preferably, there is provided the method of any one of the supplementary descriptions 1 to 21, wherein in the second layer forming step, the second layer is formed under a condition that a surface roughness RMS of the second layer is 10 nm or less.

[Supplementary Description 23]

More preferably, there is provided the method of the supplementary description 22, wherein the surface roughness RMS of the second layer is set to 1 nm or less.

[Supplementary Description 24]

Preferably, there is provided the method of any one of the supplementary descriptions 1 to 23, wherein in the second layer forming step, the second layer is formed at a growth temperature of 1000 to 1600° C.

[Supplementary Description 25]

Preferably, there is provided the method of any one of the supplementary descriptions 1 to 24, wherein in the second layer forming step, the second layer is formed so that a thickness of the second layer is 100 nm to 20 μm.

[Supplementary Description 26]

Preferably, there is provided the method of any one of the supplementary descriptions 1 to 25, wherein the first layer forming step, the annealing step, and the second layer forming step are continuously performed using the same growth apparatus.

[Supplementary Description 27]

Preferably, there is provided the method of the supplementary description 26, wherein the second layer forming step is performed without interposing a step of polishing the first layer, after the annealing step.

[Supplementary Description 28]

According to another aspect of the present disclosure, there is provided a nitride semiconductor template having a nitride semiconductor layer formed on a substrate, the nitride semiconductor layer including:

a first layer formed on the substrate, made of nitride semiconductor containing aluminum, with a substrate-side surface being nitrogen polarity plane, and with a surface on a side opposing to the nitrogen polarity plane being a group-III polarity plane; and a second layer formed on the group-III polarity plane of the first layer, and made of nitride semiconductor containing aluminum, wherein the first layer and the second layer are distinguished depending on a difference of an impurity concentration.

[Supplementary Description 29]

Preferably, there is provided the template of the supplementary description 28, wherein a first-layer-side surface roughness RMS on an interface between the first layer and the second layer, is 1 to 50 nm.

[Supplementary Description 30]

Preferably, there is provided the template of the supplementary description 28 or 29, wherein the first layer has a surface roughness RMS of the group-III polarity plane of 1 to 50 nm, and the second layer has a surface roughness RMS of a front surface of 10 nm or less.

[Supplementary Description 31]

Preferably, there is provided the template of any one of the supplementary descriptions 28 to 30, wherein the first layer has a thickness of 100 to 800 nm, and the second layer has a thickness of 100 nm to 20 μm.

[Supplementary Description 32]

Preferably, there is provided the template of any one of the supplementary descriptions 28 to 31, wherein the second layer is a crack-free layer having a thickness of 3 μm or more.

[Supplementary Description 33]

Preferably, there is provided the template of any one of the supplementary descriptions 28 to 32, wherein an average dislocation density on the front surface of the second layer is $1 \times 10^9$ numbers/cm or less.

[Supplementary Description 34]

Preferably, there is provided the template of any one of the supplementary descriptions 28 to 33, wherein an entire front surface of the second layer is the group-III polarity plane.

[Supplementary Description 35]

Preferably, there is provided the template of any one of the supplementary descriptions 28 to 34, wherein the substrate does not have a surface concavo-convex pattern, and a void due to the surface concavo-convex pattern does not exist between the substrate and the first layer.

[Supplementary Description 36]

Preferably, there is provided the template of any one of the supplementary descriptions 28 to 35, wherein the first layer and the second layer are made of aluminum nitride, indium aluminum nitride, aluminum gallium nitride, or aluminum gallium indium nitride which are represented by $In_{1-x-y}Al_xGa_yN$ (0≤x+y≤1, 0<x≤1, 0≤y≤1).

[Supplementary Description 37]

According to further another aspect of the present disclosure, there is provided a nitride semiconductor device, including:

the nitride semiconductor template of any one of the supplementary descriptions 28 to 36; and a nitride semiconductor lamination structure grown and formed on the nitride semiconductor template.

[Supplementary Description 38]

Preferably, there is provided the device of the supplementary description 37, wherein the nitride semiconductor lamination structure is constituted of a multilayer film of an n-typed film, a p-typed film, or an undoped film which are represented by $In_{1-x-y}Al_xGa_yN$ (0≤x+y≤, 0<x≤1, 0≤y≤1), and realizes a schottky diode, a pn-junction diode, a light-emitting diode, or a transistor.

What is claimed is:

1. A nitride semiconductor template having a nitride semiconductor layer formed on a substrate, the nitride semiconductor layer comprising:

a first layer formed on the substrate, made of nitride semiconductor containing aluminum, with a substrate-side surface being nitrogen polarity plane, and with a surface on a side opposing to the nitrogen polarity plane being a group-III polarity plane; and a second layer formed on the group-III polarity plane of the first layer, and made of nitride semiconductor containing aluminum, wherein the first layer and the second layer are distinguished depending on a difference of an impurity concentration, an average dislocation density on a front surface of the first layer is $1 \times 10^9$ numbers/cm$^2$ or less, an average dislocation density on a front surface of the second layer is $1 \times 10^9$ numbers/cm$^2$ or less, and the substrate is a sapphire substrate or a silicon carbide substrate.

2. The nitride semiconductor template according to claim 1, wherein the first layer has a surface roughness RMS of the group-III polarity plane of 1 to 50 nm, and the second layer has a surface roughness RMS of a front surface of 10 nm or less.

3. The nitride semiconductor template according to claim 1, wherein the first layer and the second layer are made of aluminum nitride, indium aluminum nitride, aluminum gallium nitride, or aluminum gallium indium nitride which are represented by $In_{1-x-y}Al_xGa_yN$ (0≤x+y≤1, 0<x≤1, 0≤y≤1).

4. A nitride semiconductor device, comprising
the nitride semiconductor template of claim 1, and
a nitride semiconductor lamination structure grown and
   formed on the nitride semiconductor template.

* * * * *